United States Patent
Steffan et al.

(10) Patent No.: US 6,423,557 B1
(45) Date of Patent: Jul. 23, 2002

(54) ADC BASED IN-SITU DESTRUCTIVE ANALYSIS SELECTION AND METHODOLOGY THEREFOR

(75) Inventors: Paul J. Steffan, Elk Grove; Allen S. Yu, Fremont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 16 days.

(21) Appl. No.: 09/808,785

(22) Filed: Mar. 15, 2001

(51) Int. Cl.⁷ .......................... H01L 21/66; G01R 31/26
(52) U.S. Cl. ............................. 438/16; 716/4
(58) Field of Search ................. 438/14–18, 800, 438/4, 7–9; 716/4; 483/1, 7–12

(56) References Cited

U.S. PATENT DOCUMENTS

| | | | | |
|---|---|---|---|---|
| 5,862,055 A | * | 1/1999 | Chen et al. | 364/468.28 |
| 5,966,459 A | * | 10/1999 | Chen et al. | 382/149 |
| 6,066,849 A | * | 5/2000 | Masnaghetti | 250/310 |
| 6,185,511 B1 | * | 2/2001 | Steffan et al. | |

\* cited by examiner

*Primary Examiner*—Olik Chaudhuri
*Assistant Examiner*—Craig Thompson
(74) *Attorney, Agent, or Firm*—H. Donald Nelson

(57) ABSTRACT

A method of inspecting a semiconductor wafer using scanning tools to find defects that occur during the manufacturing process and to the automatic classification, automatic selection of defects that require further analysis, the automatic selection of the equipment to perform the further analysis and the in-situ performance of the further analysis that includes destructive and non-destructive analysis.

3 Claims, 2 Drawing Sheets

ADC BASED IN-SITU DESTRUCTIVE ANALYSIS SELECTION AND METHODOLOGY THEREFOR

BACKGROUND OF THE INVENTION

1. Field of the Invention

This invention relates generally to the manufacture of high performance semiconductor devices. More specifically, this invention relates to the inspection of a semiconductor wafer using scanning tools to find defects that occur during the manufacturing process. Even more specifically, this invention relates to the automatic classification, automatic selection of defects that require further analysis, the automatic selection of the equipment to perform the further analysis and the in-situ performance of the further analysis.

2. Discussion of the Related Art

In order to remain competitive, a semiconductor manufacturer must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As is known in the semiconductor manufacturing art, the yield of chips (also known as die) from each wafer is not 100% because of defects during the manufacturing process. The number of good chips obtained from a wafer determines the yield. As can be appreciated, a chip that must be discarded because of a defect increases the cost of the remaining usable chips.

A single semiconductor chip can require numerous process steps such as oxidation, etching, metallization and wet chemical cleaning. Some of these process steps involve placing the wafer on which the semiconductor chips are being manufactured into different tools during the manufacturing process. The optimization of each of these process steps requires an understanding of a variety of chemical reactions and physical processes in order to produce high performance, high yield circuits. The ability to view and characterize the surface and interface layers of a semiconductor chip in terms of their morphology, chemical composition and distribution is an invaluable aid to those involved in research and development, process, problem solving, and failure analysis of integrated circuits. A major part of the analysis process is to determine if defects are caused by one of the process tools, and if so, which tool caused the defects.

As the wafer is placed into different tools during manufacture, each of the tools can produce different types of particles that drop onto the wafer and cause defects that have the potential to decrease the yield. In order to develop high yield semiconductor processes and to improve existing ones, it is important to identify the sources of the various particles that cause defects and then to prevent the tools from dropping these particles onto the wafer while the wafers are in the tools.

In order to be able to quickly resolve process or equipment issues in the manufacture of semiconductor products, a great deal of time, effort and money is being expended by semiconductor manufacturers to capture and classify silicon based defects. Once a defect is caught and properly described and classified, work can begin to resolve the cause of the defect and to eliminate the cause of the defect. The biggest problem facing the semiconductor manufacturers and the most difficult problem to solve is the training and maintenance of a cadre of calibrated human inspectors who can classify all defects consistently and without error. Because of human inconsistency, Automatic Defect Classification (ADC) systems were developed.

One such system for automatically classifying defects consists of the following methodological sequence: (a) gather a defect image from a review station; (b) view the defect image and assign values to elemental descriptor terms called predicates that are general descriptors such as roundness, brightness, color, hue, graininess, etc.; and (c) assign a classification code to the defect based upon the values of all the predicates. A typical ADC system can have 40 or more quantifiable qualities and properties that can be predicates. Each predicate can have a specified range of values and a typical predicate can have a value assigned to it between 1 and 256. A value of 1 indicates that none of the value is present and a value of 256 indicates that the quality represented by the predicate is ideal. For example, a straight line would have a value of 1 for the predicate indicating roundness, whereas a perfect circle would have a value of 256 for the same predicate. The classification code for each defect is determined by the system from the combination of all the predicate values assigned to the defect. The goal of the ADC system is to be able to uniquely describe all the defect types, in such a manner that a single classification code can be assigned to a defect that has been differentiated from all other defect types. This is accomplished by a system administrator who trains an artificial intelligence system to recognize various combinations and permutations of the 40 or more predicates to assign the same classification code to the same type of defect. This would result in a highly significant statistical confidence in the probability that the defect, and all other defects of the same type or class, will always be assigned the same classification code by the ADC system.

The ADC system has been going through a continuous development cycle and is gaining more and more acceptance as a relative stable proven technology and useful tool for automatically generating "insightful" information on defects captured in modern semiconductor manufacturing operations. The ADC technology can be ported to SEM and other analysis tools. These analysis tools have added capabilities beyond generating an image, and include the ability to generate a chemical spectrum of a selected material by an electron dispersal analysis (EDX), the ability to cut a hole at a selected site for cross-sectional review by fixed ion beam (FIB), the ability to cut and remove a slice of material for extremely high resolution imaging by transmission electron microscopy (TEM). If these analytical techniques could be coupled with the automatic capability of automatic defect classification (ADC), it would aid tremendously in finding root causes of defects in a product line.

Therefore, what is needed is a method of coupling the automatic defect classification capabilities with the capabilities of various analysis tools for automatic elemental analysis of a given defect of interest.

SUMMARY OF THE INVENTION

According to the present invention, the foregoing and other objects and advantages are obtained by a method of scanning a semiconductor wafer for defects that occur during the manufacturing process and automatically selecting defects for destructive and non-destructive testing.

In accordance with a first aspect of the invention, an inspection wafer is scanned for defect information, which is sent to a defect management system that selects defects to analyze in an automatic defect classification operation.

In accordance with another aspect of the invention, the automatic defect classification operation selects defects for further analysis, determines what type of analysis is required for the defects selected for further analysis and selects the equipment for the required further analysis. The automatic defect classification selects equipment from the following: fixed ion beam equipment, transmission electron microscopy equipment, electron dispersal analysis equipment, scanning electron microscopy equipment and Rutherford back scattering equipment.

In accordance with another aspect of the invention, the automatic defect classification operation causes the required further analysis to be performed in situ.

The described invention thus provides a method of automatically performing required destructive and non-destructive analysis in-situ during the manufacture of a semiconductor wafer.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment or specific embodiments of the present invention that illustrate the best mode or modes presently contemplated by the inventors for practicing the invention.

Figure 1:
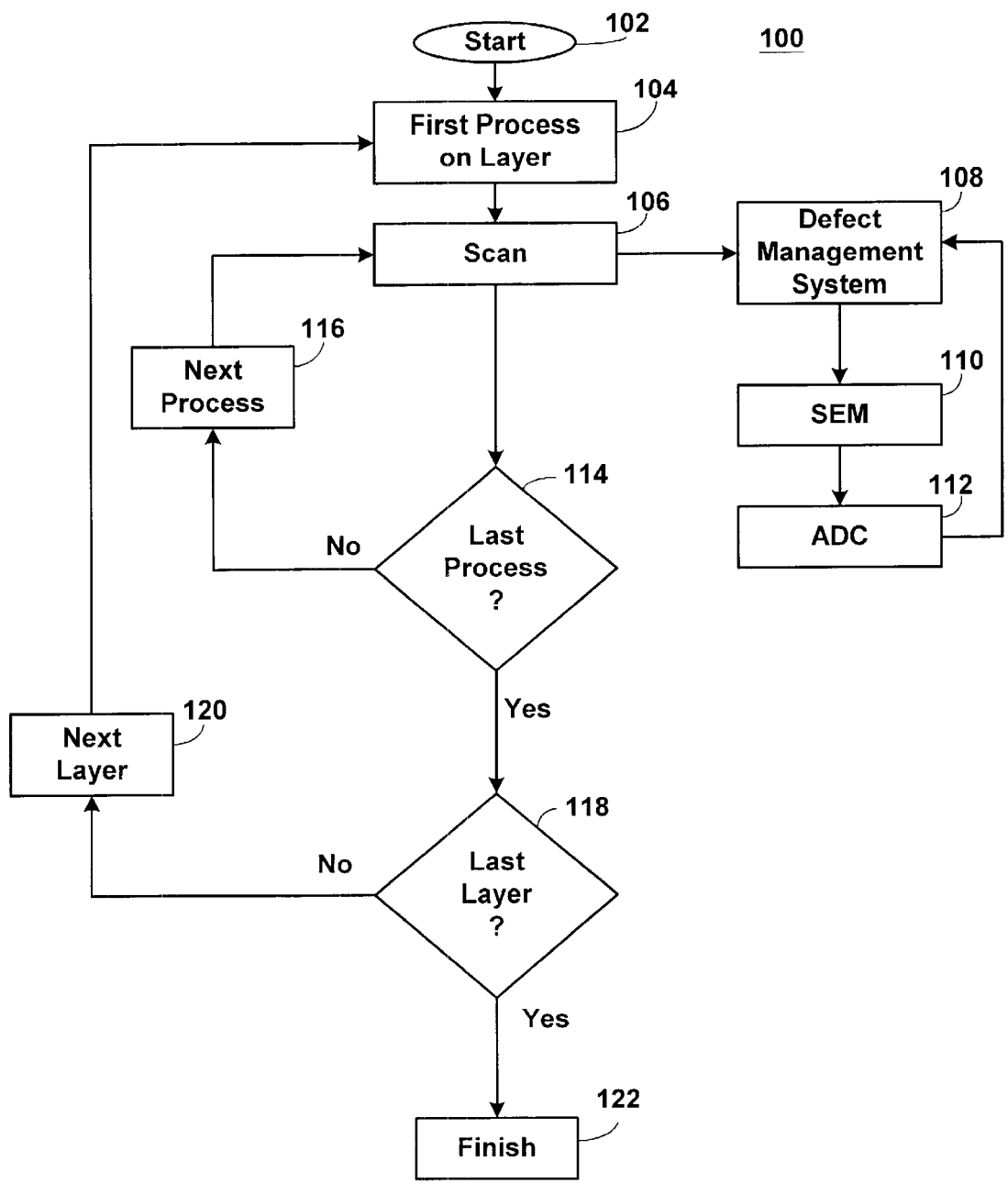
FIG. 1 is a flow diagram illustrating a standard method of capturing defects, automatically classifying the defects with an automatic defect classification (ADC) system and storing defect information including the classification of the defects in a defect management system (DMS)

FIG. 1 is a flow diagram 100 illustrating a standard method of capturing defects, automatically classifying the defects with an automatic defect classification (ADC) system and storing defect information including the classification of the defects in a defect management system (DMS). A lot of wafers is started through a manufacturing process as shown at 102. The lot of wafers is subjected to a first process at 104. If the first process is a process for which an inspection wafer will be scanned, the inspection wafer is scanned as indicated at 106. It is noted that because the scanning process, the image making process and associated processes are time and labor intensive, not all processes are scanned and not all wafers in the lot are scanned. For this reason, typically one or perhaps two wafers in the lot of wafers, which is typically about 25 wafers, are selected to serve as representative of the entire lot of wafers during the manufacturing process. In addition, only processes in which it is expected substantial numbers of defects to occur on the wafers will be checked by scanning the inspection wafer.

During the scan of the inspection wafer at 106, the scanning tool sends defect data, including location data of the defects, to a defect management system 108. The defect management system 108 selects defects for which images are to be captured and the defect information is sent to a scanning electron microscope (SEM) 110. The defect images captured by the scanning electron microscope 110 are sent to an automatic defect classification (ADC) system 112. The automatic defect classification system 112 classifies the defects and sends the defect information including the classification of the defects back to the defect management system 108, where it is available for further analysis at the discretion of a reviewer who has to reload the wafer and do the analysis offline.

After the inspection wafer is scanned at 106 it is determined at 114 if the process just conducted is the last process. If it is determined at 114 if the process just conducted is not the last process, the next process on the entire lot is conducted, as indicated at 116 and the inspection wafer is returned to the flow at 106. If it is determined at 114 that the process just conducted is the last process, it is determined at 118 if the layer just processed is the last layer. If the layer just processed is not the last layer, the next layer of the entire lot of wafer, as indicated at 120 is subjected to the first process 104 and the flow as described above repeats. If it is determined at 118 that the layer just processed is the last layer, the lot is finished as indicated at 122.

Figure 2:
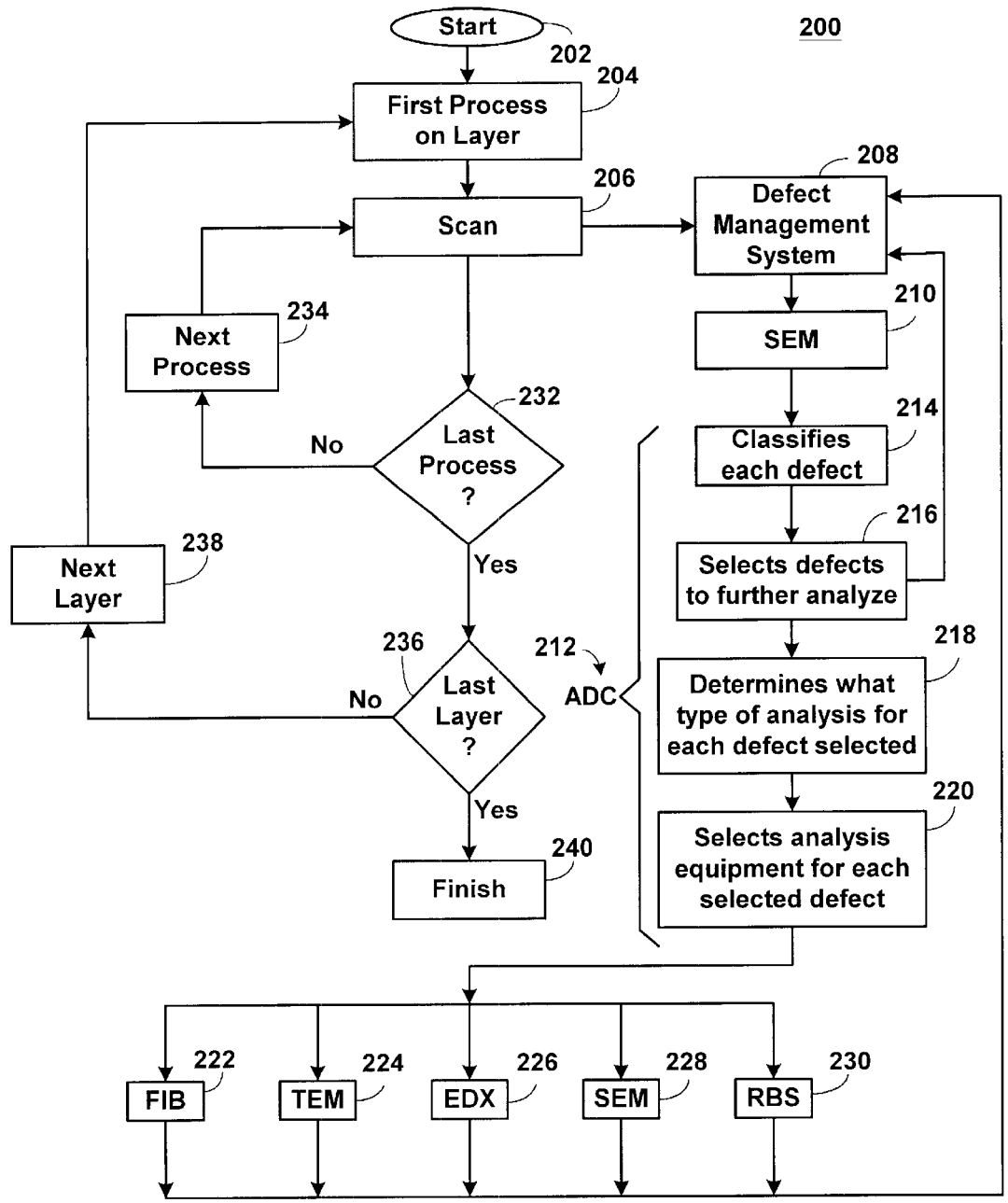
FIG. 2 is a flow diagram illustrating a method of capturing defects, automatically classifying the defects, selecting defects to further analyze and to automatically select the type of further analysis and to automatically select the equipment in which the further analysis is to be done, to automatically perform the analysis and to store the results of the further analysis.

FIG. 2 is a flow diagram 200 illustrating a method of capturing defects, automatically classifying the defects in an automatic defect classification (ADC) system, which automatically selects defects to further analyze and automatically selects the type of further analysis required and automatically selects the equipment in which the further analysis is to be done and sends the results of the further analysis to a defect management system (DMS). A lot of wafers is started through a manufacturing process as shown at 202. The lot of wafers is subjected to a first process at 204. If the first process is a process for which an inspection wafer will be scanned, the inspection wafer is scanned as indicated at 206. It is noted that because the scanning process, the image making process and associated processes are time and labor intensive, not all processes are scanned and not all wafers in the lot are scanned. For this reason, typically one or perhaps two wafers in the lot of wafers, which is typically about 25 wafers, are selected to serve as representative of the entire lot of wafers during the manufacturing process. In addition, only processes in which it is expected substantial numbers of defects to occur on the wafers will be checked by scanning the inspection wafer.

During the scan of the inspection wafer at 206, the scanning tool sends defect data, including location data of the defects, to a defect management system 208. The defect management system 208 selects defects for which images are to be captured and the defect information is sent to a scanning electron microscope (SEM) 210. The scanning electron microscope 210 includes an ADC operation, indicated at 212, that comprises a logical system that selects defects for further analytical work, such as EDX (electron dispersal analysis). The ADC operation 212 categorizes recaptured defects into certain general bins that include a particle bin, a pattern bin and an embedded particle bin. The ADC operation 212 further categorizes the defects for example: on the surface, below a pattern, in a film as well as sizing and location information. The ADC operation 212 uses these input parameters to utilize a Boolean logic that has been programmed by a program administrator to determine whether to switch to an automatic mode to perform an EDX or other in-situ destructive or non-destructive analysis for the current defect in review. The Boolean logic could be programmed, for example to select an EDX analysis for the current defect in review if the defect is larger than a certain size (minimally the EDX limit), if no other defect of this ADC type has been analyzed, if the defect is located in a particular region of the wafer, for example, by quadrant, radial from center (annular), or where the defect is located within a die. If an EDX analysis is selected by the ADC, the ADC operation 212 will perform the steps required to do the EDX for the isolated current defect and associated background, capture the image of the EDX spectrums, attach them to the defect file, switch back to SEM mode and continue with the ADC operation 212 and image capture process, repeating for every defect in the selected by the DMS 208. Similar procedures would be established for other analysis tools that would be selected by the ADC operation 212. The ADC operation begins by classifying each defect at 214, selects defects to further analyze 216, determines what type of analysis is required for each defect 218 and selects the proper analysis equipment for each selected defect 220. The proper analysis equipment includes an FIB (fixed ion beam) 222, a TEM (transmission electron microscopy) 224, an EDX (electron dispersal analysis) 226, an SEM (scanning electron microscope) 228, and an RBS (Rutherford back scattering) machine 230. It should be understood that other analysis equipment could be added.

After the inspection wafer is scanned at 206 it is determined at 232 if the process just conducted is the last process. If it is determined at 232 if the process just conducted is not the last process, the next process on the entire lot is conducted, as indicated at 234 and the inspection wafer is returned to the flow at 206. If it is determined at 232 that the process just conducted is the last process, it is determined at 236 if the layer just processed is the last layer. If the layer just processed is not the last layer, the next layer of the entire lot of wafer, as indicated at 238 is subjected to the first process 204 and the flow as described above repeats. If it is determined at 236 that the layer just processed is the last layer, the lot is finished as indicated at 240.

The ADC operation as described allows enriched information to be automatically gathered with minimal impact on throughput. The wafer is already in a high vacuum environment, the defect image has already been captured, and the enriched information can be collected without removing the wafer from the high vacuum environment unlike the systems of the prior art, which requires the wafer to be placed back into an environment for the defect to be recaptured (located) and for the further analyses to be done. The one downside is that the added analysis overhead will slow down the throughput. However, the benefits are:

1. Helps prevent lost opportunity for analysis when a lot is moved on before the decision is made to gather more information.
2. Gives engineers real time data for disposition decisions and root cause analysis.
3. Minimizes time on hold for EDX analysis, which is normally done after SEM.

In summary, the described invention provides a method of automatically performing required destructive and non-destructive analysis in-situ during the manufacture of a semiconductor wafer.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing semiconductor devices, the method comprising:
   (a) processing a layer on a lot of semiconductor wafers;
   (b) selecting at least on inspection wafer from the lot of semiconductor wafers;
   (c) scanning the at least on inspection wafer for defect information;
   (d) automatically selecting defects in the defect management system for analysis and defect information for the selected defects is sent to an automatic defect classification operation that automatically determines which of the selected defects require further analysis, automatically determines what further analysis is required, automatically selects a required tool for the further required analysis and automatically sends the defects selected for further analysis to the selected tool; and
   (e) sending results of the further analysis to the defect management system.

2. The method of claim 1 wherein the selected tool is selected from the following list of equipment; an FIB, a TEM, an EDX, an SEM and an RBS.

3. The method of claim 2 further comprising storing data from the further analysis in the defect management system.

* * * * *